United States Patent
Huang

(10) Patent No.: US 9,128,158 B2
(45) Date of Patent: Sep. 8, 2015

(54) DETECTION CIRCUIT FOR DETECTING COIL ABNORMALITY OF DC FAN MOTOR

(71) Applicant: ASIA VITAL COMPONENTS CO., LTD., Sinjhuang District, New Taipei City (TW)

(72) Inventor: Po-Sheng Huang, New Taipei (TW)

(73) Assignee: ASIA VITAL COMPONENTS CO., LTD., New Taipei (TW)

( * ) Notice: Subject to any disclaimer, the term of this patent is extended or adjusted under 35 U.S.C. 154(b) by 249 days.

(21) Appl. No.: 13/933,073

(22) Filed: Jul. 1, 2013

(65) Prior Publication Data

US 2015/0002188 A1     Jan. 1, 2015

(51) Int. Cl.
*G01R 31/34* (2006.01)
*G01P 3/48* (2006.01)
*G01P 3/46* (2006.01)

(52) U.S. Cl.
CPC ............ *G01R 31/346* (2013.01); *G01R 31/343* (2013.01); *G01P 3/46* (2013.01); *G01P 3/48* (2013.01)

(58) Field of Classification Search
CPC .... G01R 31/343; G01R 31/34; G01R 31/346; G01R 31/006; G01R 31/025; G01P 3/48; G01P 3/46; G01P 3/44; G01P 3/489

USPC ............ 324/765.01, 177, 546, 547, 555, 139, 324/143, 772

See application file for complete search history.

(56) References Cited

U.S. PATENT DOCUMENTS

| | | | | |
|---|---|---|---|---|
| 4,973,896 | A  * | 11/1990 | Shiga et al. | 322/28 |
| 6,617,816 | B2 * | 9/2003 | Ohno et al. | 318/560 |
| 6,633,145 | B2 * | 10/2003 | Shao et al. | 318/400.35 |
| 8,514,092 | B2 * | 8/2013 | Cao et al. | 340/644 |
| 2001/0004321 | A1 * | 6/2001 | Nakano | 363/40 |
| 2013/0017097 | A1 * | 1/2013 | Zhou | 417/42 |

* cited by examiner

*Primary Examiner* — Huy Q Phan
*Assistant Examiner* — Thang Le

(57) ABSTRACT

The present invention relates to a detection circuit for detecting coil abnormality of a DC fan motor, which is applied to a fan. The detection circuit comprises at least one detection unit and a processing unit. The detection unit is used to detect and receive the voltage signal at the center point of the coil set of the fan stator and perform a clamping process and a inverting process on the voltage signal to generate an inverted voltage signal such that the processing unit compares the inverted voltage signal with a predetermined value and determines to generate a notifying signal to a remote device. Thus, the effect of effective real-time monitoring the fan can be achieved.

14 Claims, 7 Drawing Sheets

DETECTION CIRCUIT FOR DETECTING COIL ABNORMALITY OF DC FAN MOTOR

BACKGROUND OF THE INVENTION

1. Field of the Invention

The present invention relates to a detection circuit and in particular to a detection circuit for detecting coil abnormality of a DC fan motor, which achieves the effects of effective real-time monitoring a fan and notification.

2. Description of Prior Art

With the progress of technology, the developing trend of electronic products is toward multi-function, miniaturization, and high operational security. However, with increasingly powerful electronic features, lots of heat generated during the operation becomes a problem. To overcome such a problem, a motor-driven fan device is used for the design of heat dissipation. Consequently, with the trend of electronic products miniaturization, the design of the fan motor also should tend toward miniaturization.

For a general communication case or electronic apparatus, large air flow is required to forcibly dissipate the generated heat. Thus, a number of fans are combined to form a fan module through which the heat generated within the communication case or electronic apparatus can be dissipated forcibly and quickly such that the electronic component therein can achieve the effect of stable operation. However, another problem is incurred. That is, when the coil of one fan in the fan module fails to rotate (e.g., an open circuit or a short circuit), the abnormal fan blade is affected by its surrounding air flow (i.e., affected by the air flow exhausted from the other fans) and can be continuously driven to rotate by its surrounding air flow such that the user can not immediately observe by eyes the damaged fan in the fan module. Alternatively, the Hall element in the abnormal fan is continuously rotated due to the rotation of the permanent magnet of the fan rotor, further normally providing the rotation speed signal for the controller which sends the signal to the external system. Accordingly, the damaged fan can not be found immediately. Hence, immediate replacement of the damaged fan and fan status monitoring can not be easily performed, further resulting in degradation of heat dissipation.

In summary, the prior art suffer from the following shortcomings:

1. The effect of immediate notification can not be achieved.
2. The effect of immediate fan status monitoring and fan replacement can not be achieved.
3. Heat dissipation is degraded.

Therefore, how to overcome the above problems and disadvantages is the focus which the inventor and the related manufacturers in this industry have been devoting themselves to.

SUMMARY OF THE INVENTION

Thus, to effectively overcome the above shortcomings, one objective of the present invention is to provide a detection circuit for detecting coil abnormality of a DC fan motor, which can achieve the effect of immediate notification.

Another objective of the present invention is to provide a detection circuit for detecting coil abnormality of a DC fan motor, which can achieve the effects of immediate fan status monitoring and fan replacement.

Yet another objective of the present invention is to provide a detection circuit for detecting coil abnormality of a DC fan motor, which avoids the effect of degraded heat dissipation.

To achieve the above objectives, the present invention provides a detection circuit for detecting coil abnormality of a DC fan motor, which is applied to a fan comprising a stator having at least one coil set and a silicon steel set, the coil set wound around the silicon steel set and having a first terminal, a second terminal, and at least one detection terminal, the respective first and second terminals receiving a voltage signal, the detection terminal disposed between the first and second terminals, the detection circuit comprising at least one detection unit and a processing unit. The detection unit comprises a clamper and an inverter, wherein one end of the damper is connected to the corresponding detection terminal and the other end thereof is connected to an end of the inverter, wherein the clamper performs a clamping process based on the voltage level of the voltage signal received from the detection terminal to generate a regulated voltage signal sent to the inverter, whereby the inverter performs an inverting process based on the received regulated voltage signal to generate an inverted voltage signal.

An end of the above-mentioned processing is connected to a corresponding end of the inverter, wherein the processing unit compares the received inverted voltage signal with a predetermined value therein to determine to generate a notifying signal to let a remote device monitor the face status. By means of the design of the detection circuit of the present invention, the effects of immediate notification and immediate fan status monitoring can be achieved. Further, the degradation of heat dissipation can be avoided.

DETAILED DESCRIPTION OF THE INVENTION

The above objectives of the present invention and the features of structure and function of the present invention are described according to the preferred embodiments in figures.

Figure 1:
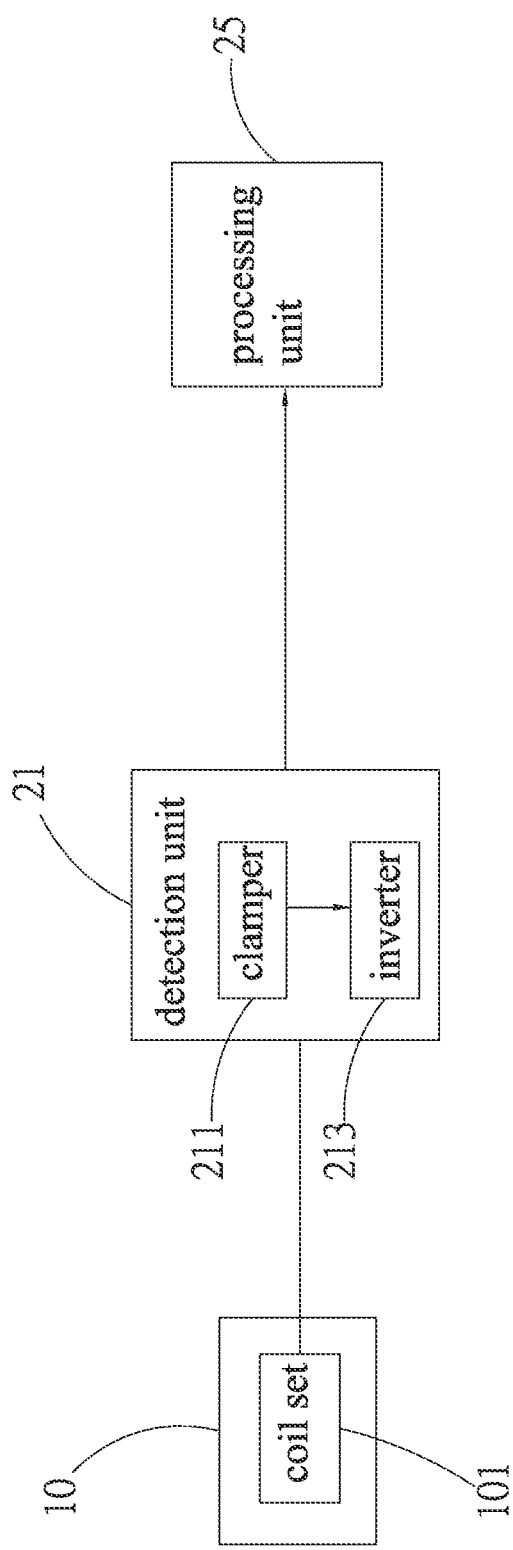
FIG. 1 is a block diagram according to the first preferred embodiment of the present invention.

The present invention provides a detection circuit for detecting coil abnormality of a DC fan motor. Please refer to FIGS. 1 and 2, which show the block diagram and circuit diagram according to the first preferred embodiment of the present invention, respectively. Also, please refer to FIG. 3. The detection circuit is applied to a fan (not shown) which comprises a stator 10 and a rotor (not shown). The stator 10 has at least one coil set 101 and a silicon steel set 103. The coil set 101 is wound around the silicon steel set 103 to correspond to the magnetic member (e.g., the magnet) to be magnetically excited. The coil set 101 has a first terminal 1011, a second terminal 1012, and at least one detection terminal 1014. The respective first and second terminals 1011, 1012 receive a voltage signal, respectively.

In addition, the detection terminal 1014 is disposed between the first and second terminals 1011 1012. In the preferred embodiment, the detection terminal 1014 is disposed at the center point between the first and second terminals 1011, 1012 for explanation, but not limited to this. In practice, the user can design a plurality of detection terminals 1014, such as two, three, or more detection terminals, disposed between the first and second terminals 1011, 1012 according to the accuracy requirement. Besides, in the preferred embodiment, the fan motor uses a single phase four-pole motor for explanation, but not limited to this. In practice, a three-phase or multi-phase motor can also be used. If a three-phase brushless motor is used, there will be three coil sets 101; each has the first and second terminals 1011, 1012, and the detection terminals 1014.

Further, the detection circuit comprises at least one detection unit 21 and a processing unit 25. The detection unit 21 comprises a clamper 211 and an inverter 213. One end of the damper 211 is connected to the corresponding detection terminal 1014 of the coil set 101 and the other end thereof is connected to an end of the inverter 213. The damper 211 performs a clamping process based on the voltage level of the voltage signal received from the detection terminal 1014 to generate a regulated voltage signal. That is, the clamper 211 puts the voltage level of the voltage signal at the detection terminal 1014 (i.e., the combined voltage signal of the voltages signals of the first and second terminals 1011, 1012) down to zero level and then generates the regulated voltage signal which is sent to the inverter 213.

Figure 2:
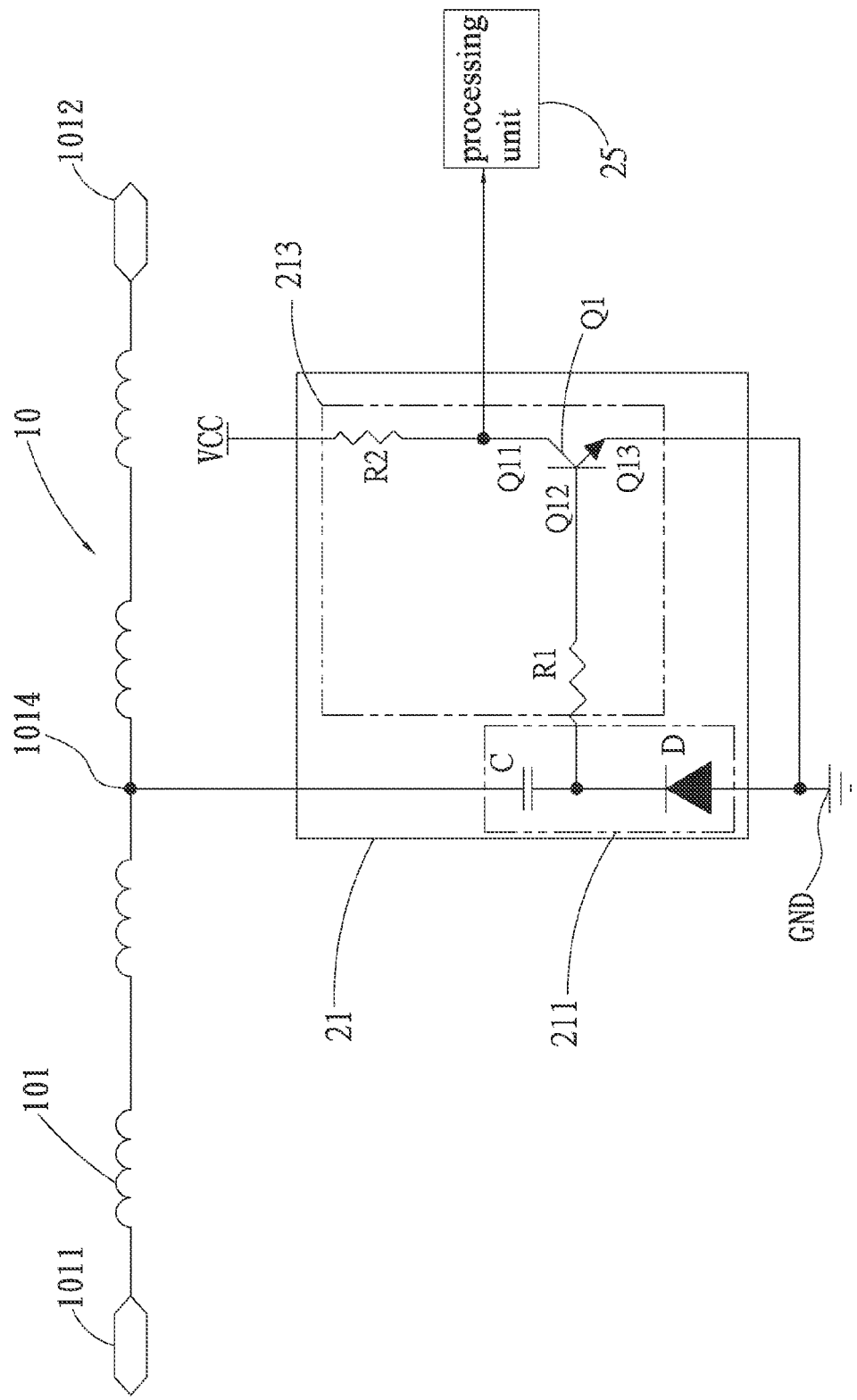
FIG. 2 is a circuit diagram according to the first preferred embodiment of the present invention.
Figure 3:
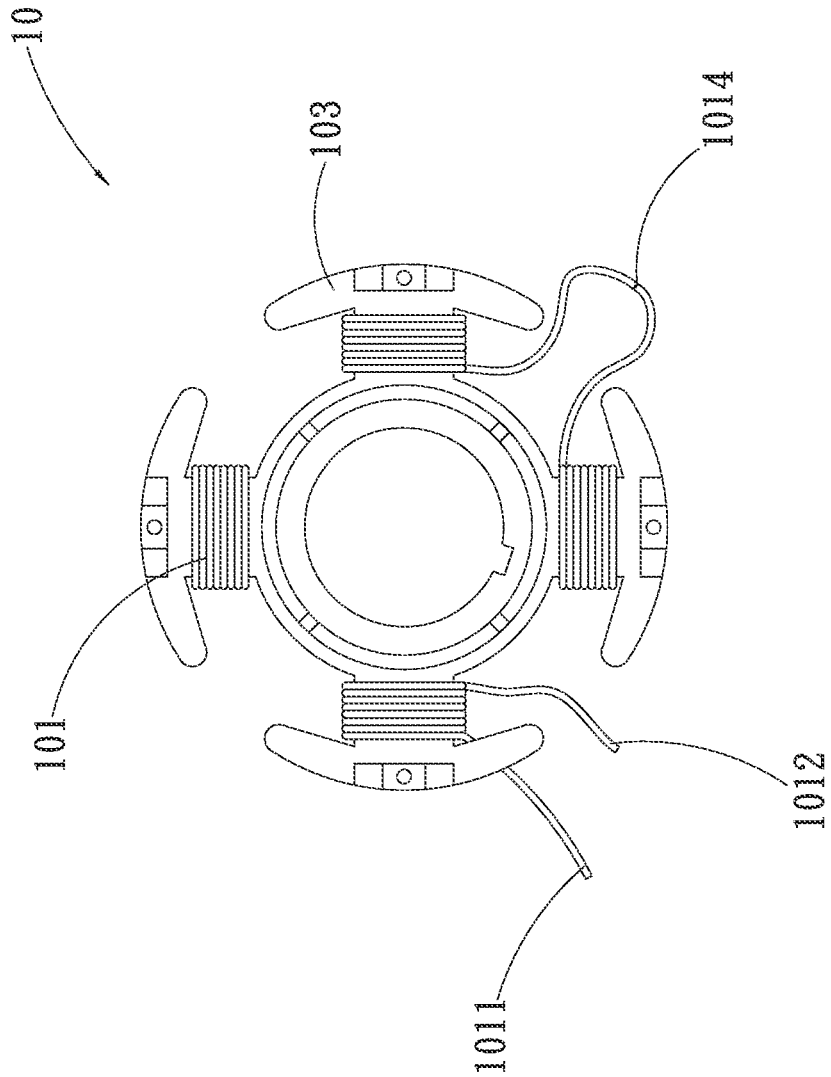
FIG. 3 is a top schematic view of the stator of the present invention.

Please continue to refer to FIGS. 2 and 3. The clamper 211 has a capacitor C and a diode D. One end of the capacitor C is coupled to the detection terminal 1014 disposed at the center point between the first and second terminals 1011, 1012; the other end thereof is coupled to the cathode end of the diode D. The capacitor C is used to isolate the DC current. The anode end of the diode D is connected to a ground GND.

Also, the inverter 213 performs an inverting process based on the received regulated voltage signal to generate an inverted voltage signal. In the preferred embodiment, the inverted voltage signal is a square wave (i.e., a digital signal) for explanation, but not limited to this. The inverter 213 comprises a first resistor R1, a second resistor R2, and a switch Q1. The switch Q1 in the preferred embodiment is a BJT transistor for explanation, but not limited to this. In practice, a NMOS transistor can also be used. The switch Q1 has a first end Q11, a second end Q12, and a third end Q13. The first end Q11 is coupled to one end of the second resistor R2; the other end of the second resistor R2 is coupled to an operating voltage VCC. The second end Q12 is coupled to one end of the first resistor R1; the other end of the first resistor R1 is connected to the other end of the capacitor C and to the cathode end of the diode D. The third end Q13 is coupled to the ground GND.

Furthermore, an end of the processing unit 25 is connected to a corresponding end of the inverter 213 (i.e., the first end Q11 of the inverter 213). The processing unit 25 compares the received inverted voltage signal with a predetermined value therein to determine to generate a notifying signal. The predetermined value is a predetermined duty cycle for explanation, but not limited to this; a predetermined voltage can also be used. In practice, the user can adjust the value of the predetermined duty cycle or predetermined voltage according to the design (e.g., the predetermined duty cycle of 60% or predetermined voltage of 3 Volt). The notifying signal is the signal determined by the processing unit 25 to indicate a fan abnormality (e.g., a damaged coil or a short circuit).

That is, the processing unit 25 compares the duty cycle of the received inverted voltage signal with the predetermined value therein. The processing unit 25 does not transmit the notifying signal to a connected remote device 3 if the processing unit 25 determines that the duty cycle (for example, the duty cycle of 60%) of the received inverted voltage signal is consistent with the predetermine value (for example, the predetermined value of 60%), and the processing unit 25 transmits the notifying signal to the remote device 3 if the processing unit 25 determines that the duty cycle (for example, the duty cycle of 25%) the received inverted voltage signal is not consistent with the predetermine value (for example, the predetermined value of 60%). Thus, the remote device 3 can recognize the fan abnormality according to the notifying signal, and the immediate fan replacement and maintenance can be performed; further the effects of effective immediate fan status monitoring and notifying can be achieved.

Moreover, the remote device 3 is connected to the processing unit 25 via either wired (e.g., signal wire) or wireless (e.g., 3G communication, Bluetooth communication, Wi-Fi communication or 4G communication) connection. If the remote device 3 is connected to the processing unit 25 via the wireless communication, the processing unit 25 will perform the wireless communication with the remote device 3 via a connected wireless transceiver module (not shown). In the preferred embodiment, the remote device 3 is a desktop computer for explanation, but not limited to this; a laptop, a portable device (a smart phone, PDA), or a tablet device (iPad, a tablet computer) can also be used.

By means of the design of the detection circuit of the present invention, the effects of immediate user notification and fan status monitoring can be effectively achieved, allowing the user to be informed immediately to replace or maintain the problematic fan. Further, the degraded heat dissipation can be avoided.

In addition, the detection circuit of the present invention can be applied to a fan module (not shown in the figures) having a plurality of fans, each equipped with the detection circuit of the present invention such that the user can monitor the status of each fan via the remote device 3 and knows which fan of the fan module is abnormal via the notifying signal. Thus, the effects of immediate replacement and maintenance can be achieved, further effectively avoiding the degradation of the whole heat dissipation associated with the fan module.

Figure 4:
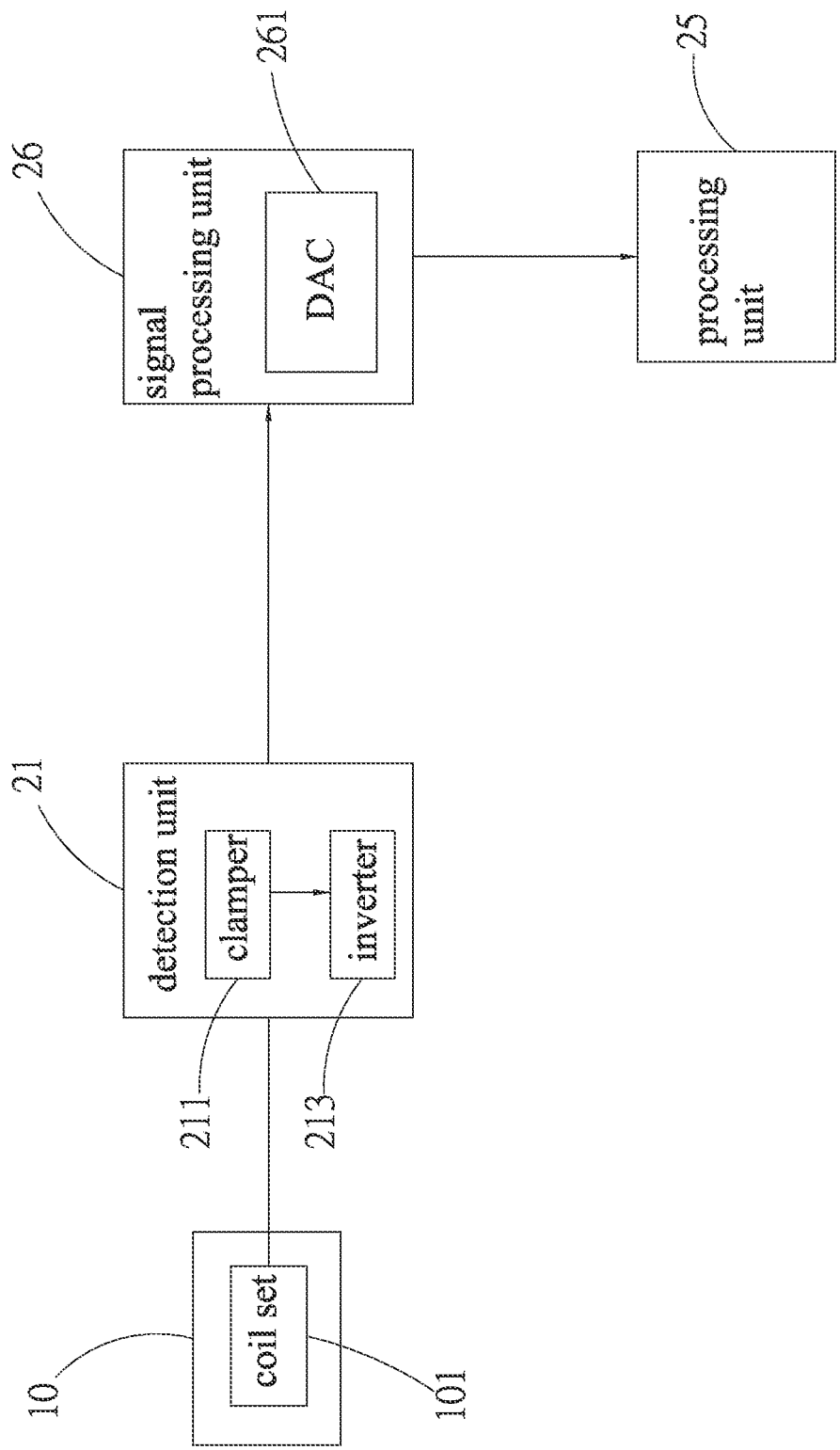
FIG. 4 is a block diagram according to the second preferred embodiment of the present invention.
Figure 5:
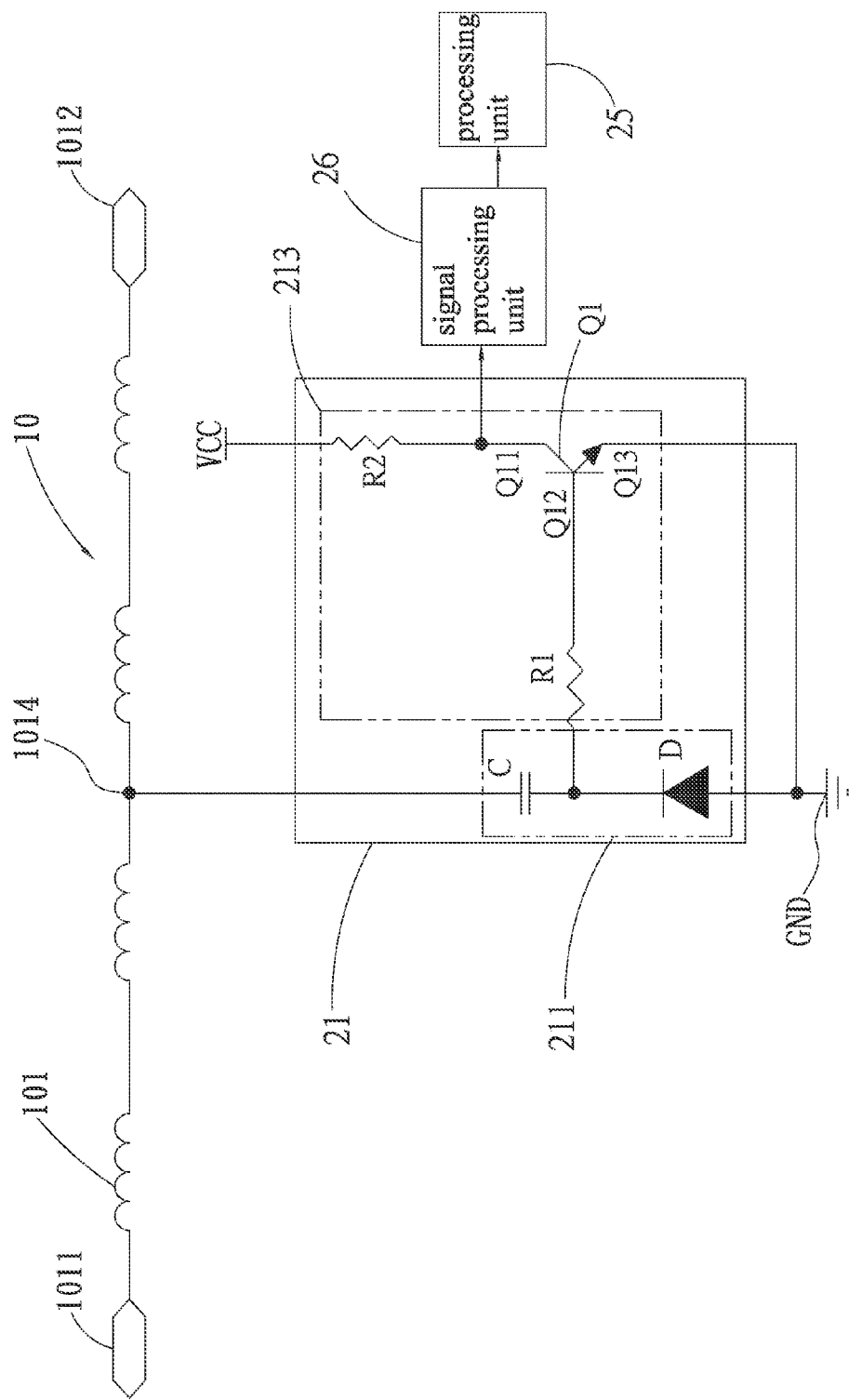
FIG. 5 is a circuit diagram according to the second preferred embodiment of the present invention.

Please refer to FIGS. 4 and 5, which show the block diagram and circuit diagram according to the second preferred embodiment of the present invention, respectively. Also, please refer to FIG. 3. The structure and connection relationship of the second preferred embodiment are the same as those of the first preferred embodiment and will not be described here again. The difference between these two embodiments is that in the second preferred embodiment the detection circuit further comprises a signal processing unit 26. One end of the signal processing unit 26 is connected to the corresponding end of the inverter 213 and the other end thereof is connected to the processing unit 25. That is, the first end Q11 of the inverter 213 is coupled to one end of the second resistor R2 and to one end of the signal processing unit 26; the other end of the second resistor R2 is coupled to an operating voltage VCC. The second end Q12 of the inverter 213 is coupled to one end of the first resistor R1; the other end of the first resistor R1 is connected to the other end of the capacitor C and to the cathode end of the diode D. The third end Q13 of the inverter 213 is coupled to the ground GND and the other end of the signal processing unit 26 is connected to the corresponding processing unit 25.

Further, the signal processing unit comprises a DAC (Digital-to-Analog Converter) 261. The DAC 261 is for converting the received inverted voltage signal to an analog inverted voltage signal which is then sent to the processing unit 25. The processing unit 25 compares the received inverted voltage signal with a predetermined value therein to determine to generate a notifying signal. The previously mentioned predetermined value in the preferred embodiment is a predetermined voltage for explanation. The processing unit 25 does not transmit the notifying signal to the remote device 3 if the processing unit 25 determines that the voltage level (for example, 3 Volt) of the analog inverted voltage signal is equal to the predetermine value (for example, the predetermined voltage of 3 Volt) and the processing unit transmits the notifying signal to the remote device 3 if the processing unit 25 determines that the voltage level (for example, 4.5 Volt or 2.5 Volt) of the analog inverted voltage signal is greater than or less than the predetermine value (for example, the predetermined voltage of 3 Volt). Thus, the remote device 3 can recognize the fan abnormality according to the notifying signal, and the immediate fan replacement and maintenance can be performed; further the effects of effective immediate fan status monitoring and notifying can be achieved.

By means of the design of the detection circuit of the present invention, the effects of immediate user notification and fan status monitoring can be effectively achieved, allowing the user to be informed immediately to replace or maintain the problematic fan. Further, the degraded heat dissipation can be avoided.

Figure 6:
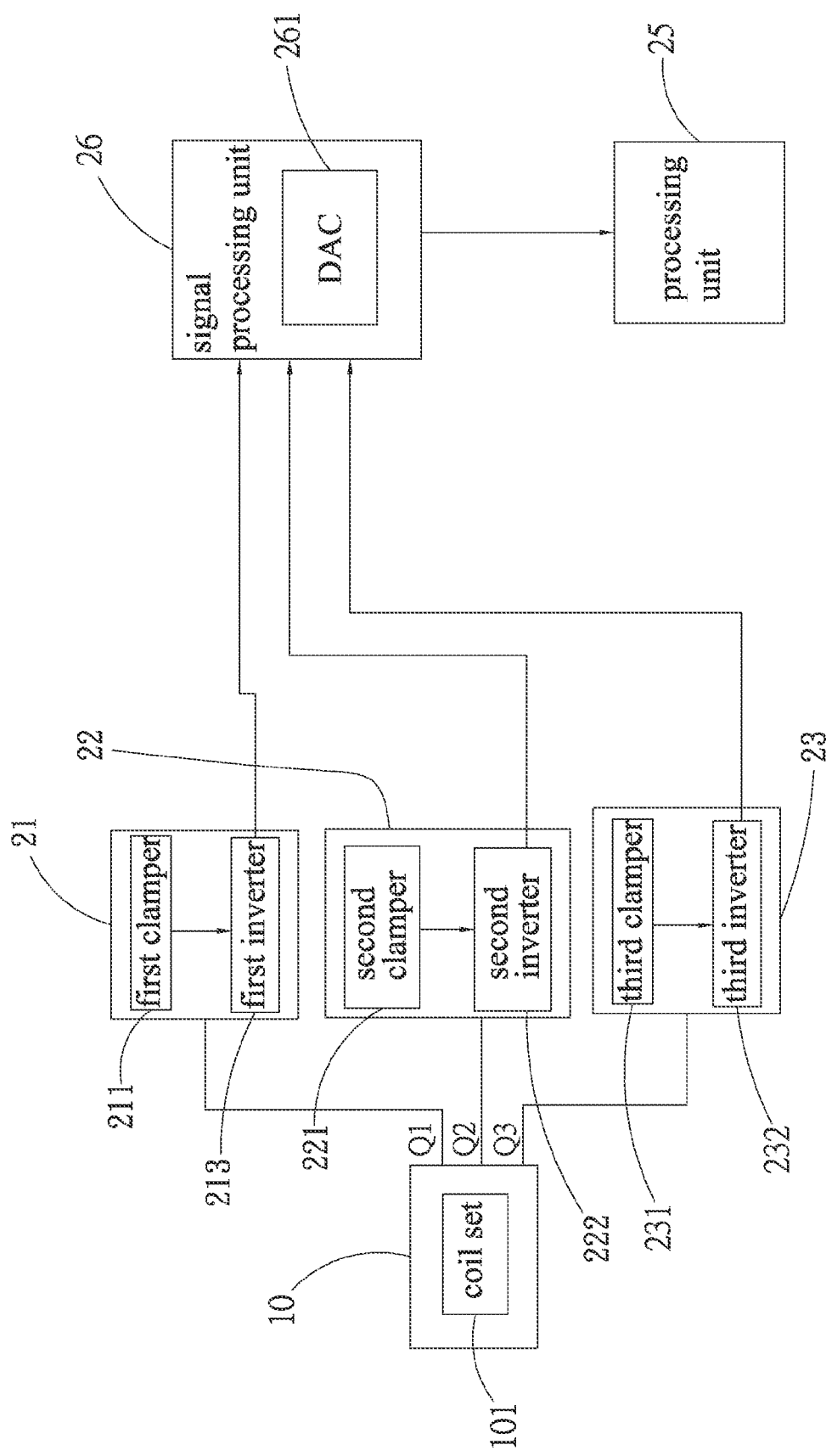
FIG. 6 is a block diagram according to the third preferred embodiment of the present invention.
Figure 7:
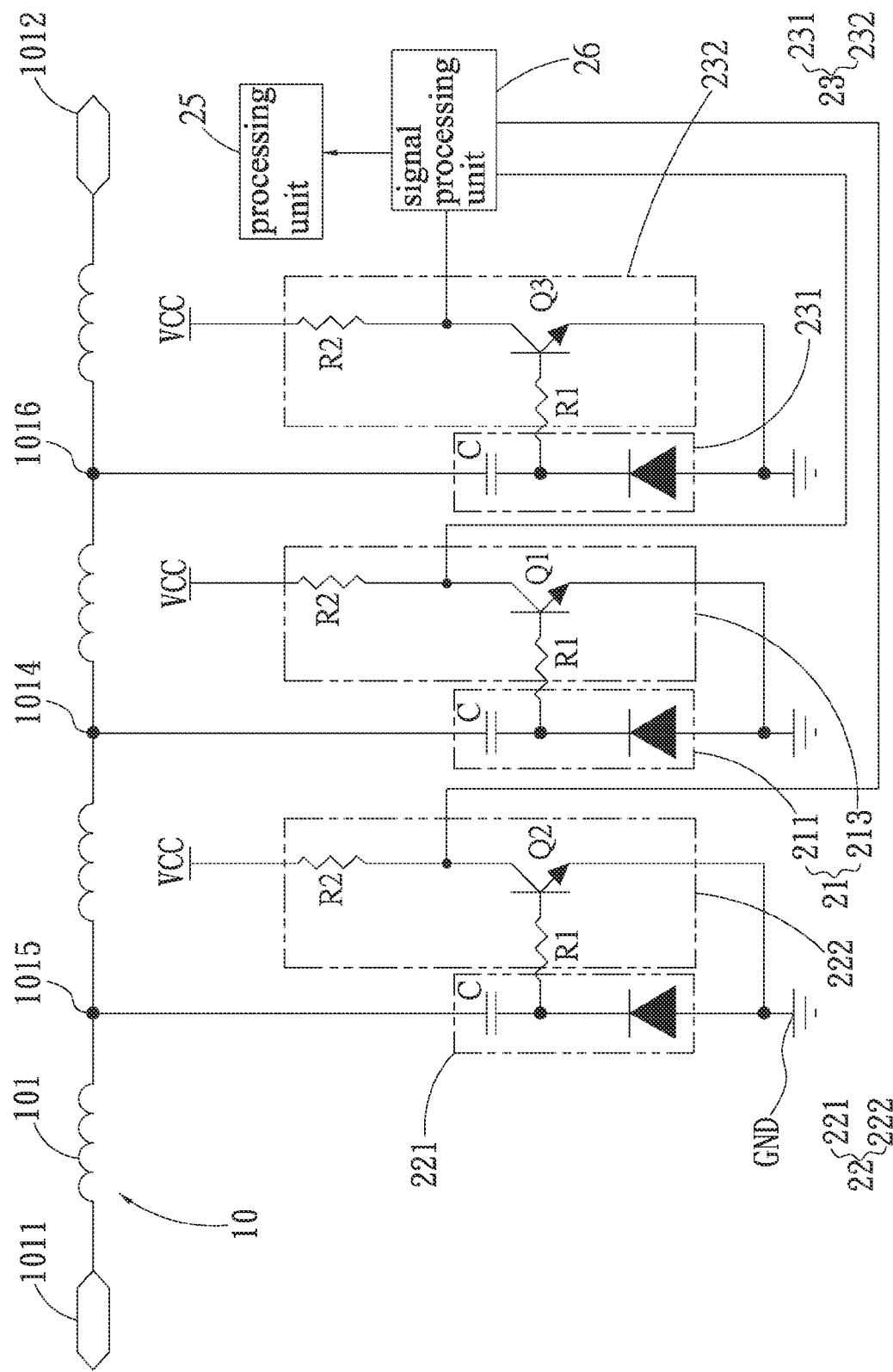
FIG. 7 is a circuit diagram according to the third preferred embodiment of the present invention.

Please refer to FIGS. 6 and 7, which show the block diagram and circuit diagram according to the third preferred embodiment of the present invention, respectively. Also, please refer to FIG. 3. The structure and connection relationship of the third preferred embodiment are roughly similar to those of the second preferred embodiment and will not be described here again. The difference between these two embodiments is that in the third preferred embodiment the detection units comprise a first detection unit 21, a second detection unit 22, and a third detection unit 23. The structure and connection relationship of the first detection unit 21 in the third preferred embodiment are the same as those in the second preferred embodiment and will not be described here again. For convenient description, the detection unit 21, the damper 211, and the inverter 213 in the first preferred embodiment are named as the first detection unit 21, the first damper 211, and the first inverter 213 in the third preferred embodiment, respectively. That is, one end of the first clamper 211 is connected to a first detection terminal 1014 (i.e., the detection terminal 1014 in the second preferred embodiment) of the corresponding coil set 101; the other end thereof is connected to an end of the first inverter 213. The first damper 211 performs the clamping process based on the voltage level of the first end voltage signal received from the first detection terminal 1014 to generate a regulated first end voltage signal sent to the first inverter 213, whereby the first inverter 213 performs the inverting process based on the received regulated first end voltage signal to generate a first end inverted voltage signal.

Also, a second detection unit 22 has a second clamper 221 and a second inverter 222. One end of the second damper 221 is connected to a second detection terminal 1015 of the corresponding coil set 101; the other end thereof is connected to an end of the second inverter 222. The second clamper 221 performs the clamping process based on the voltage level of the second end voltage signal received from the second detection terminal 1015 to generate a regulated second end voltage signal sent to the second inverter 222, whereby the second inverter 222 performs the inverting process based on the received regulated second end voltage signal to generate a second end inverted voltage signal.

Further, a third detection unit 23 has a third damper 231 and a third inverter 232. One end of the third clamper 231 is connected to a third detection terminal 1016 of the corresponding coil set 101; the other end thereof is connected to an end of the third inverter 232. The third damper 231 performs the clamping process based on the voltage level of the third end voltage signal received from the third detection terminal to generate a regulated third end voltage signal sent to the third inverter 232, whereby the third inverter 232 performs the inverting process based on the received regulated third end voltage signal to generate a third end inverted voltage signal.

Besides, the structure and connection relationship of the components inside the second clamper 221 and the second inverter 222 of the second detection unit 22 are roughly similar to those of the capacitor C and the diode D inside the first clamper 211 of the first detection unit 21 and the first resistor R1, the second resistor R2, and the switch Q1 inside the first inverter 213 of the first detection unit 21. That is, the second clamper 211 similarly has a capacitor C and a diode D; the second inverter 222 similarly has a first resistor R1, a second resistor R2, and a switch Q2. The only difference is that one end of the capacitor C of the first damper 211 is coupled to the corresponding first detection terminal 1014; one end of the capacitor C of the second damper 221 is coupled to the corresponding second detection terminal 1015.

The structure and connection relationship of the components inside the third damper 231 and the third inverter 232 of the third detection unit 23 are roughly similar to those of the capacitor C and the diode D inside the first clamper 211 of the first detection unit 21 and the first resistor R1, the second resistor R2, and the switch Q1 inside the first inverter 213 of the first detection unit 21. That is, the third clamper 231 similarly has a capacitor C and a diode D; the third inverter 232 similarly has a first resistor R1, a second resistor R2, and a switch Q3. The only difference is that one end of the capacitor C of the third clamper 231 is coupled to the corresponding third detection terminal 1016.

Please refer to FIGS. 6 and 7. The first ends of the first, second, and third inverters 213, 222, 232 are sequentially connected to one end of the DAC 261 of the signal processing unit 26 to sequentially convert the received first, second, and third end inverted voltage signals to the first, second, and third end analog inverted voltage signals, which are then sent to the processing unit 25. The processing unit 25 compares the voltage levels of the received first, second and third end analog inverted voltage signals with the predetermined value therein to determine to generate the notifying signal sent to the remote device 3. The processing unit 25 transmits the notifying signal to the connected remote device 3 if the processing unit 25 determines that the voltage level (e.g., 4.5 Volt or 2.5 Volt) of the first end analog inverted voltage signal is greater than or less than the predetermine value (e.g., the predetermined value of 3 Volt), and the processing unit does not transmit the notifying signal to the remote device 3 if the processing unit 25 determines that the voltage level (e.g., 3 Volt) of the first end analog inverted voltage signal is equal to the predetermine value (e.g., the predetermined value of 3 Volt).

Also, the processing unit 25 compares the voltage level of the second end analog inverted voltage signal with that of the third end analog inverted voltage signal. The processing unit 25 transmits the notifying signal to the connected remote device 3 if the processing unit 25 determines that the voltage level of the second end analog inverted voltage signal is not consistent with that of the third end analog inverted voltage signal, and the processing unit 25 does not transmit the notifying signal to the remote device 3 if the processing unit 25 determines that the voltage level of the second end analog inverted voltage signal is consistent with that of the third end analog inverted voltage signal.

By means of the design of the present invention in which the processing unit 25 determines to generate the notifying signal to the remote device 3 based on the detection and comparison result of the first, second, and third detection units 21, 22, 23, the effects of immediate user notification and fan status monitoring can be effectively achieved, allowing the user to be informed immediately to replace or maintain the problematic fan. Further, the degraded heat dissipation can be avoided.

In summary, the present invention has the following advantages over the prior art:
1. The effect of immediate notification.
2. The effect of immediate fan status monitoring, facilitating the user to perform the replacement or maintenance.
3. The degradation of the whole heat dissipation is avoided.

It will be understood that the above description is only about some preferred embodiments. All variations regarding the above method, shape, structure, and device according to the claimed scope of the present invention should be embraced by the scope of the appended claims of the present invention.

What is claimed is:

1. A detection circuit for detecting coil abnormality of a DC fan motor, which is applied to a fan comprising a stator having at least one coil set and a silicon steel set, the coil set wound around the silicon steel set and having a first terminal, a second terminal, and at least one detection terminal, the respective first and second terminals receiving a voltage signal, the detection terminal disposed between the first and second terminals, the detection circuit comprising:
at least one detection unit comprising a damper and an inverter, wherein one end of the clamper is connected to the corresponding detection terminal and the other end thereof is connected to an end of the inverter, wherein the clamper performs a clamping process based on the voltage level of the voltage signal received from the detection terminal to generate a regulated voltage signal sent to the inverter, whereby the inverter performs an inverting process based on the received regulated voltage signal to generate an inverted voltage signal; and
a processing unit, an end of the processing unit connected to a corresponding end of the inverter, wherein the processing unit compares the received inverted voltage signal with a predetermined value therein to determine to generate a notifying signal.

2. The detection circuit according to claim 1, wherein the processing unit compares the duty cycle of the received inverted voltage signal with the predetermined value therein, wherein the processing unit does not transmit the notifying signal to a connected remote device if the processing unit determines that the duty cycle of the received inverted voltage signal is consistent with the predetermine value, and the processing unit transmits the notifying signal to the remote device if the processing unit determines that the received inverted voltage signal is not consistent with the predetermine value.

3. The detection circuit according to claim 1, further comprising a signal processing unit, wherein one end of the signal processing unit is connected to the corresponding end of the inverter and the other end thereof is connected to the processing unit, wherein the signal processing unit has a DAC for converting the received inverted voltage signal to an analog inverted voltage signal which is then sent to the processing unit.

4. The detection circuit according to claim 3, wherein the processing unit compares the voltage level of the analog inverted voltage signal with the predetermined value therein, wherein the processing unit transmits the notifying signal to a connected remote device if the processing unit determines that the voltage level of the analog inverted voltage signal is greater than or less than the predetermine value, and the processing unit does not transmit the notifying signal to the remote device if the processing unit determines that the voltage level of the analog inverted voltage signal is equal to the predetermine value.

5. The detection circuit according to claim 1, wherein the clamper has a capacitor and a diode, one end of the capacitor coupled to the detection terminal disposed at the center point between the first and second terminals, the other end thereof coupled to the cathode end of the diode, the anode end of the diode connected to a ground.

6. The detection circuit according to claim 5, wherein the inverter comprises a first resistor, a second resistor, and a switch having a first end, a second end, and a third end, the first end coupled to one end of the second resistor, the other end of the second resistor coupled to an operating voltage, the second end coupled to one end of the first resistor, the other end of the first resistor connected to the other end of the capacitor and to the cathode end of the diode, the third end coupled to the ground.

7. The detection circuit according to claim 3, wherein the clamper has a capacitor and a diode, one end of the capacitor coupled to the detection terminal disposed at the center point between the first and second terminals, the other end thereof coupled to the cathode end of the diode, the anode end of the diode connected to a ground.

8. The detection circuit according to claim 7, wherein the inverter comprises a first resistor, a second resistor, and a switch having a first end, a second end, and a third end, the first end coupled to one end of the second resistor and to one end of the signal processing unit, the other end of the second resistor coupled to an operating voltage, the second end coupled to one end of the first resistor, the other end of the first resistor connected to the other end of the capacitor and to the cathode end of the diode, the third end coupled to the ground.

9. The detection circuit according to claim 1, wherein the detection units comprises:
a first detection unit having a first clamper and a first inverter, one end of the first damper connected to a corresponding first detection terminal, the other end thereof connected to an end of the first inverter, wherein the first clamper performs the clamping process based on the voltage level of the first end voltage signal received from the first detection terminal to generate a regulated first end voltage signal sent to the first inverter, whereby the first inverter performs the inverting process based on the received regulated first end voltage signal to generate a first end inverted voltage signal;
a second detection unit having a second clamper and a second inverter, one end of the second clamper connected to a corresponding second detection terminal, the other end thereof connected to an end of the second inverter, wherein the second clamper performs the clamping process based on the voltage level of the second end voltage signal received from the second detection terminal to generate a regulated second end voltage signal sent to the second inverter, whereby the second inverter performs the inverting process based on the received regulated second end voltage signal to generate a second end inverted voltage signal; and a third detection unit having a third damper and a third inverter, one end of the third damper connected to a corresponding third detection terminal, the other end thereof connected to an end of the third inverter, wherein the third clamper performs the clamping process based on the voltage level of the third end voltage signal received from the third detection terminal to generate a regulated third end voltage signal sent to the third inverter, whereby the third inverter performs the inverting process based on the received regulated third end voltage signal to generate a third end inverted voltage signal.

10. The detection circuit according to claim 9, further comprising a signal processing unit, wherein one end of the signal processing unit is connected to the respective other end of the first, second, and third inverters, wherein the signal processing unit has a DAC converting the received first, second, and third end inverted voltage signals to a first, a second, and a third end analog inverted voltage signals, respectively, which are then sent to the processing unit.

11. The detection circuit according to claim 10, wherein the processing unit compares the voltage level of the first end analog inverted voltage signal with the predetermined value therein, wherein the processing unit transmits the notifying signal to a connected remote device if the processing unit determines that the voltage level of the first end analog inverted voltage signal is greater than or less than the predetermine value, and the processing unit does not transmit the notifying signal to the remote device if the processing unit determines that the voltage level of the first end analog inverted voltage signal is equal to the predetermine value.

12. The detection circuit according to claim 11, wherein the processing unit compares the voltage level of the second end analog inverted voltage signal with the that of the third end analog inverted voltage signal, wherein the processing unit transmits the notifying signal to the connected remote device if the processing unit determines that the voltage level of the second end analog inverted voltage signal is not consistent with that of the third end analog inverted voltage signal, and the processing unit does not transmit the notifying signal to the remote device if the processing unit determines that the voltage level of the second end analog inverted voltage signal is consistent with that of the third end analog inverted voltage signal.

13. The detection circuit according to claim 2, wherein the remote device is connected to the processing unit via either wired or wireless connection.

14. The detection circuit according to claim 4, wherein the remote device is connected to the processing unit via either wired or wireless connection.

* * * * *